(12) United States Patent
Hu

(10) Patent No.: US 11,706,888 B2
(45) Date of Patent: Jul. 18, 2023

(54) POSITIONING STRUCTURE

(71) Applicant: Acer Incorporated, New Taipei (TW)

(72) Inventor: Li-Hua Hu, New Taipei (TW)

(73) Assignee: Acer Incorporated, New Taipei (TW)

( * ) Notice: Subject to any disclaimer, the term of this patent is extended or adjusted under 35 U.S.C. 154(b) by 114 days.

(21) Appl. No.: 17/364,757

(22) Filed: Jun. 30, 2021

(65) Prior Publication Data

US 2022/0141984 A1 May 5, 2022

(30) Foreign Application Priority Data

Oct. 29, 2020 (TW) .................................. 109214247

(51) Int. Cl.
*H05K 7/14* (2006.01)
*F16B 2/06* (2006.01)

(52) U.S. Cl.
CPC .................... *H05K 7/14* (2013.01); *F16B 2/06* (2013.01)

(58) Field of Classification Search
CPC .............. H05K 7/14; H05K 7/142; F16B 2/06
See application file for complete search history.

(56) References Cited

U.S. PATENT DOCUMENTS

| | | | | |
|---|---|---|---|---|
| 5,499,163 A * | 3/1996 | Sonntag | ................. | H05K 7/142 361/752 |
| 6,752,276 B2 * | 6/2004 | Rumney | ................. | H05K 7/142 361/801 |
| 8,085,552 B2 * | 12/2011 | Takao | .................... | H05K 3/368 361/810 |
| 8,098,497 B2 * | 1/2012 | Chiang | .................. | H05K 7/142 361/810 |
| 9,386,719 B2 * | 7/2016 | Lin | ........................ | H05K 7/183 |
| 10,264,694 B1 * | 4/2019 | Lin | ........................ | G06F 1/185 |
| 11,445,629 B2 * | 9/2022 | Hsieh | ....................... | H05K 7/12 |
| 2009/0111296 A1 * | 4/2009 | Zhu | ..................... | H01R 12/7005 439/78 |

(Continued)

FOREIGN PATENT DOCUMENTS

| | | | | |
|---|---|---|---|---|
| DE | 1236037 | B | * | 3/1967 |
| DE | 1238088 | B | * | 4/1967 |

(Continued)

*Primary Examiner* — Stanton L Krycinski
(74) *Attorney, Agent, or Firm* — JCIPRNET

(57) ABSTRACT

A positioning structure adapted for installing and fixing at least two storage devices having different sizes is provided. Each storage device has a plugging end and a fixing end. The positioning structure includes a casing, a socket disposed on the casing, at least two position-limiting components protruding from the casing, and a fixing bracket detachably engaged with any one of the position-limiting components. The plugging end of each storage device is adapted to be plugged into the socket. The position-limiting components respectively keep a first distance and a second distance greater than the first distance from the socket. According to the size of the storage device to be installed, the fixing bracket is engaged with the position-limiting component keeping the first distance from the socket or the position-limiting component keeping the second distance from the socket to fix the fixing end of the storage device to the fixing bracket.

7 Claims, 6 Drawing Sheets

(56) References Cited

U.S. PATENT DOCUMENTS

| | | | |
|---|---|---|---|
| 2009/0185356 A1* | 7/2009 | Liao | H05K 7/142 |
| | | | 361/759 |
| 2013/0163213 A1* | 6/2013 | Chiu | G06F 1/184 |
| | | | 361/752 |
| 2015/0009639 A1* | 1/2015 | Papakos | H05K 7/1424 |
| | | | 361/752 |

FOREIGN PATENT DOCUMENTS

| | | | |
|---|---|---|---|
| DE | 1266375 B | * | 4/1968 |
| DE | 2005344 A1 | * | 9/1970 |
| GB | 892184 A | * | 3/1962 |

* cited by examiner

POSITIONING STRUCTURE

CROSS-REFERENCE TO RELATED APPLICATION

This application claims the priority benefit of Taiwan application serial no. 109214247, filed on Oct. 29, 2020. The entirety of the above-mentioned patent application is hereby incorporated by reference herein and made a part of this specification.

BACKGROUND

Technical Field

The disclosure relates to a positioning structure, and in particular to a positioning structure applied to a storage device.

Description of Related Art

With the increase in data processing capacity and computing capacity, computer hosts or servers need to be equipped with high-performance storage devices to meet the demand for high-performance computing. At present, solid-state drives (SSDs) have become the mainstream in the market. According to different sizes, solid-state drives may be roughly divided into four specifications. In the process of installing and positioning the SSDs in the computer host or server casing, the installation personnel must choose fixing brackets having different sizes to cooperate with the SSDs having different specifications. Therefore, the universality of the existing installation and positioning structure applied to the SSDs is not good.

SUMMARY

The disclosure provides a positioning structure, which has excellent universality.

The disclosure provides a positioning structure adapted for installing and fixing at least two storage devices having different sizes. Each of the storage devices has a plugging end and a fixing end. The positioning structure includes a casing, a socket disposed on the casing, at least two position-limiting components protruding from the casing, and a fixing bracket detachably engaged with any one of the position-limiting components. The plugging end of each of the storage devices is adapted to be plugged into the socket. The position-limiting components respectively keep a first distance and a second distance greater than the first distance from the socket. The fixing bracket is detachably engaged with the position-limiting component keeping the first distance from the socket, so that the fixing end of the storage device having a smaller size is fixed to the fixing bracket. Alternatively, the fixing bracket is detachably engaged with the position-limiting component keeping the second distance from the socket, so that the fixing end of the storage device having a bigger size is fixed to the fixing bracket.

Based on the above, in the positioning structure of the disclosure, the installation personnel can adjust the engagement position of the fixing bracket on the casing according to the size of the storage device, and then lock the storage device to the fixing bracket. Based on the cooperation of a single-sized fixing bracket and multiple position-limiting structures on the casing, the positioning structure of the disclosure may be universally used for at least two storage devices having different sizes. Not only is it not necessary to choose fixing brackets having different sizes to cooperate with storage devices having different specifications, it is also fairly convenient for the installation personnel to detach and install.

To make the aforementioned more comprehensible, several embodiments accompanied with drawings are described in detail as follows.

DESCRIPTION OF THE EMBODIMENTS

Figure 1:
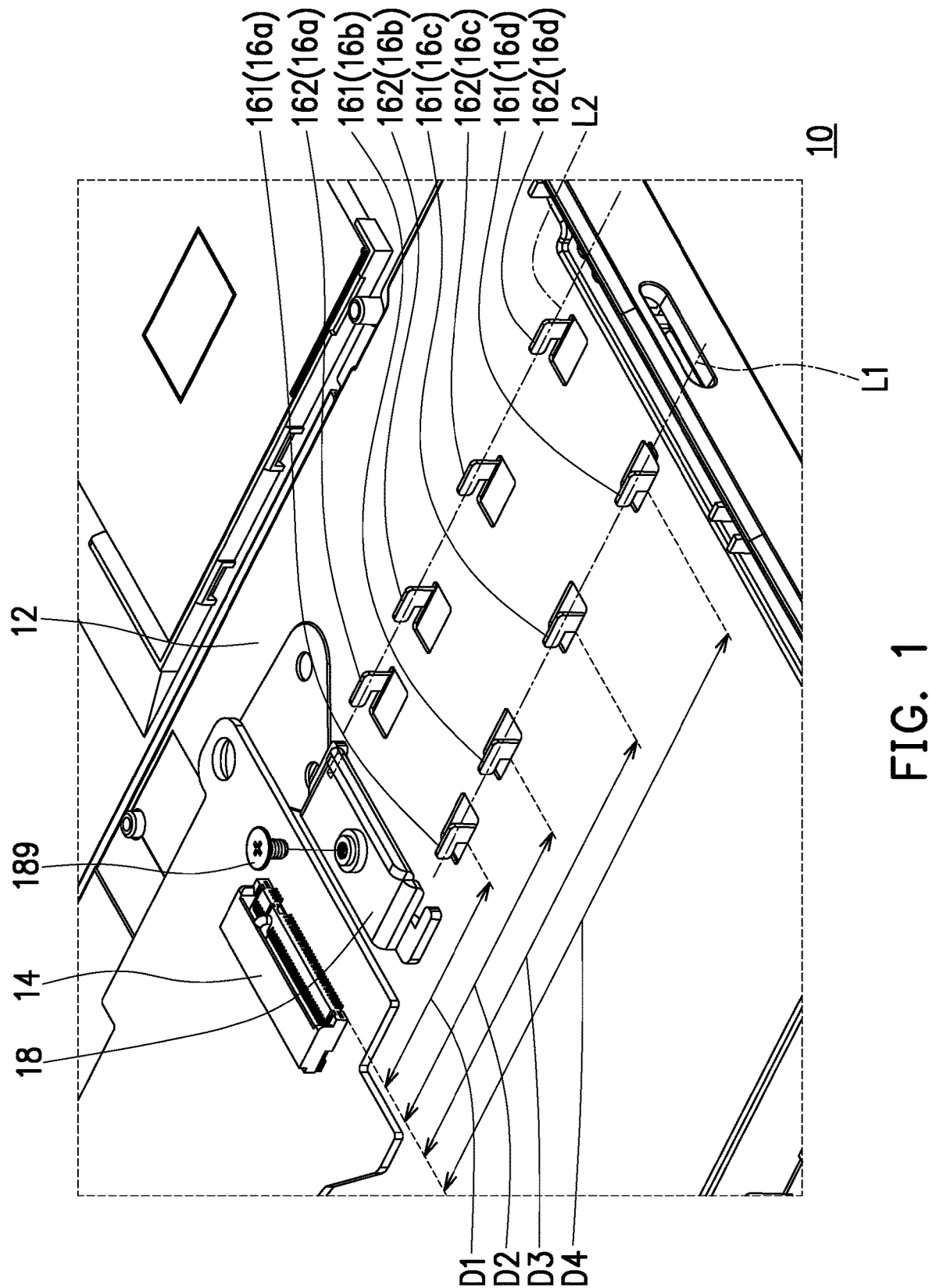
FIG. 1 is a partial exploded schematic diagram of a positioning structure according to an embodiment of the disclosure.
Figure 2:
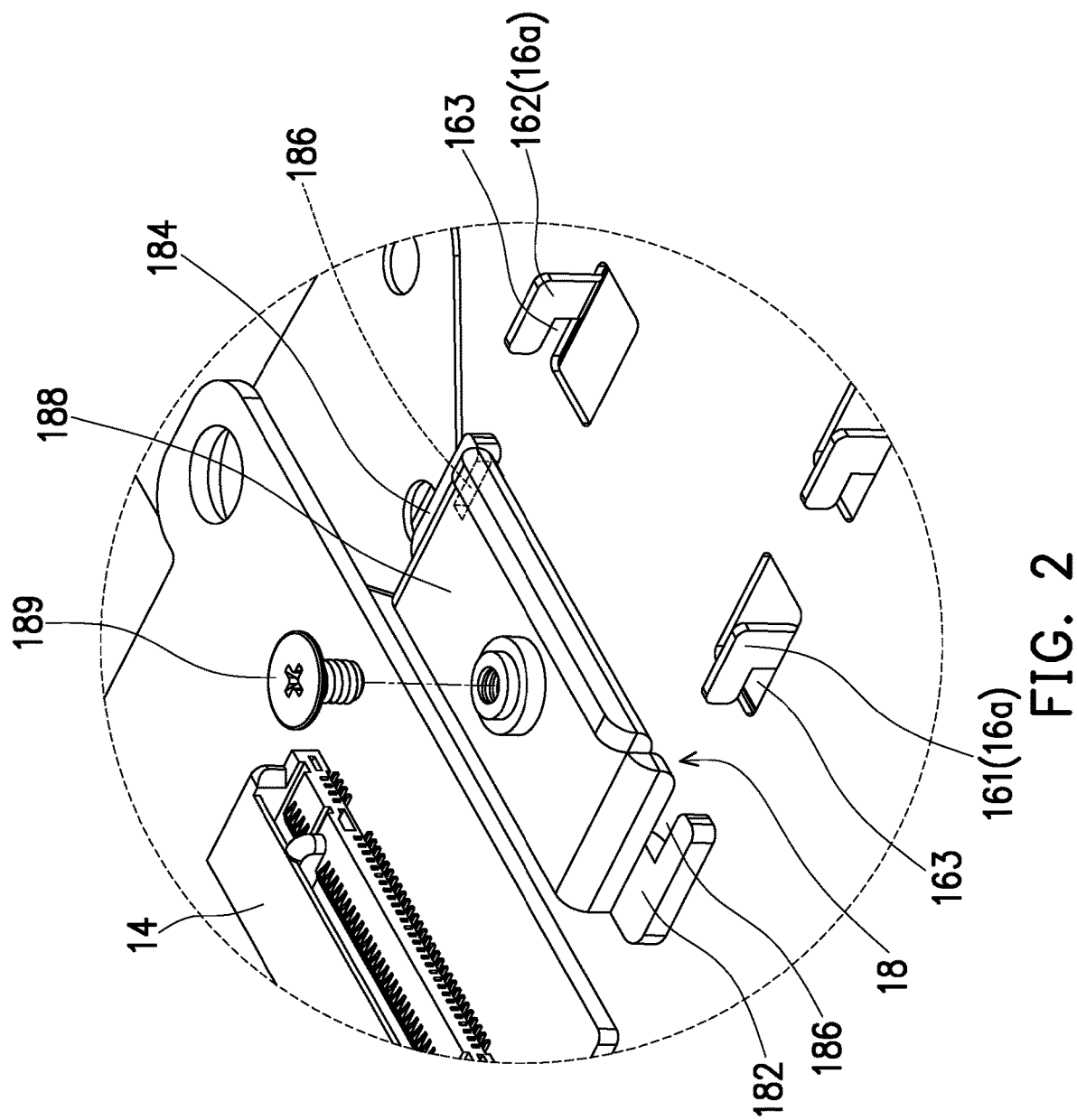
FIG. 2 is a partial enlarged schematic diagram of FIG. 1.

FIG. 1 is a partial exploded schematic diagram of a positioning structure according to an embodiment of the disclosure. FIG. 2 is a partial enlarged schematic diagram of FIG. 1. Please refer to FIGS. 1 and 2. In this embodiment, a positioning structure 10 may be a part of a computer host or a server, and is used to install and fix storage devices having different specifications and sizes in the computer host or the server. In detail, the positioning structure 10 includes a casing 12, a socket 14, a first position-limiting component 16a to a fourth position-limiting component 16d, and a fixing bracket 18. The socket 14 is disposed on the casing 12, and the first position-limiting component 16a to the fourth position-limiting component 16d protrude from the casing 12. The fixing bracket 18 is detachably disposed on the casing 12, so the installation personnel may adjust the distance between the fixing bracket 18 and the socket 14 according to the specification and size of the storage device (such as a solid-state drive).

Furthermore, the first position-limiting component 16a to the fourth position-limiting component 16d are integrally formed on the casing 12, and may be formed by stamping technology. The first position-limiting component 16a to the fourth position-limiting component 16d are located on a same side of the socket 14 and are arranged in sequence. More specifically, the first position-limiting component 16a is closest to the socket 14, and the fourth position-limiting component 16d is farthest away from the socket 14. On the other hand, the second position-limiting component 16b and the third position-limiting component 16c are located between the first position-limiting component 16a and the fourth position-limiting component 16d, and the second position-limiting component 16b is located between the first position-limiting component 16a and the third position-limiting component 16c.

The first position-limiting component 16a keeps a first distance D1 from the socket 14, and the second position-limiting component 16b keeps a second distance D2 from the socket 14. The third position-limiting component 16c keeps a third distance D3 from the socket 14, and the fourth position-limiting component 16d keeps a fourth distance D4 from the socket 14. The fourth distance D4 is greater than the third distance D3, the third distance D3 is greater than the second distance D2, and the second distance D2 is greater than the first distance D1.

The installation personnel may engage the fixing bracket 18 with any one of the first position-limiting component 16a to the fourth position-limiting component 16d according to installation requirements to adjust the engagement position of the fixing bracket 18 on the casing 12 while adjusting the distance between the fixing bracket 18 and the socket 14. Based on the cooperation of the single-sized fixing bracket 18 and the first position-limiting component 16a to the fourth position-limiting component 16d on the casing 12, the positioning structure 10 may be universally used for a variety of storage devices having different sizes. Not only is it not necessary to choose fixing brackets having different sizes to cooperate with storage devices having different specifications, it is also fairly convenient for the installation personnel to detach and install.

Please refer to FIGS. 1 and 2. In this embodiment, the first position-limiting component 16a to the fourth position-limiting component 16d have the same structural design, and the first position-limiting component 16a to the fourth position-limiting component 16d all include first position-limiting protrusions 161 and second position-limiting protrusions 162 disposed in pairs or symmetrically disposed. In detail, the first position-limiting protrusions 161 of the first position-limiting component 16a to the fourth position-limiting component 16d are arranged along a first path L1, and the second position-limiting protrusions 162 of the first position-limiting component 16a to the fourth position-limiting component 16d are arranged along a second path L2 parallel to the first path L1. The first path L1 and the second path L2 may extend through the socket 14 or extend through both sides of the socket 14 to improve the positioning accuracy of the fixing bracket 18 and the storage device.

Figure 3:
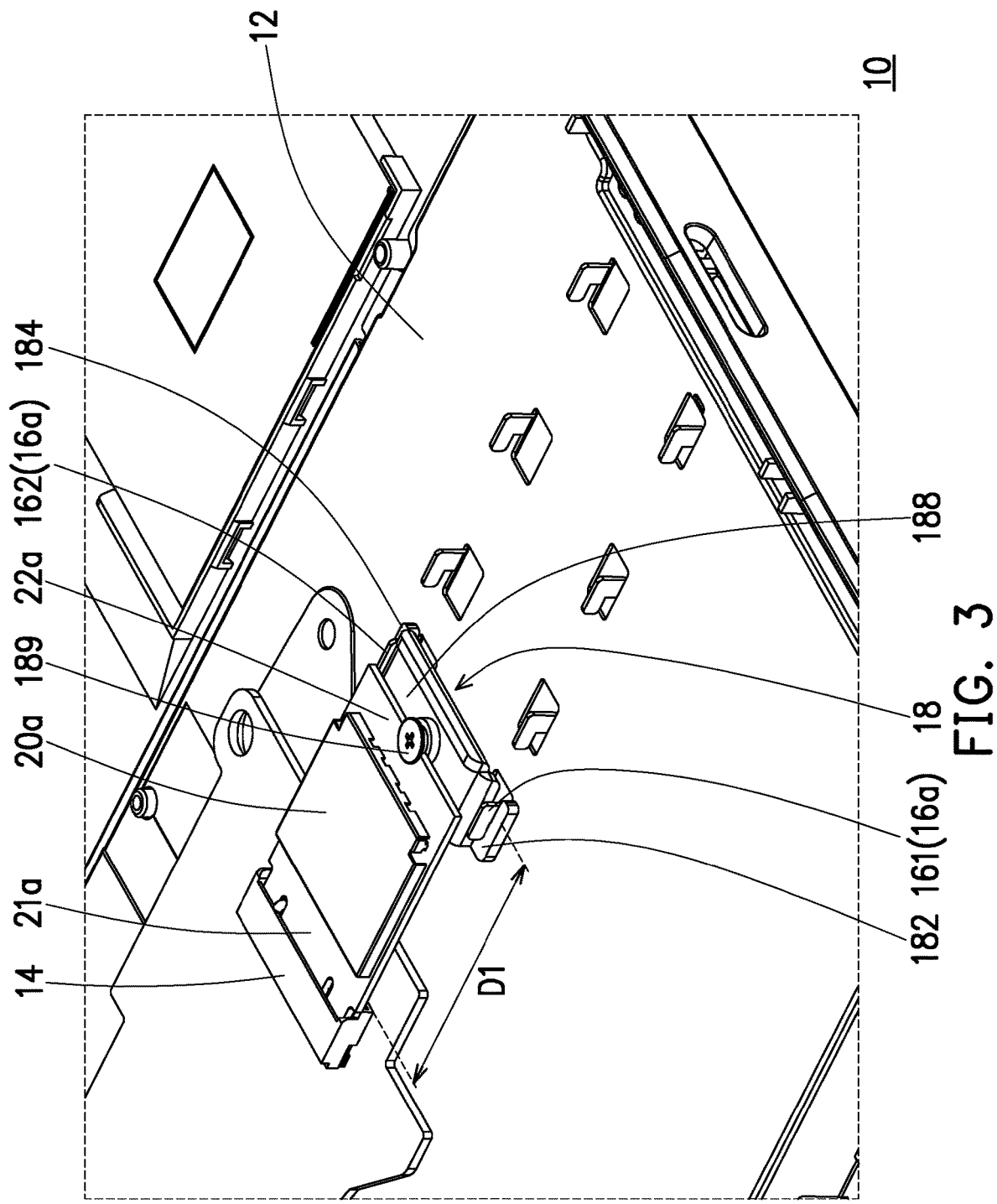
FIG. 3 is a schematic diagram of the positioning structure and a first storage device fixed thereon according to an embodiment of the disclosure.

FIG. 3 is a schematic diagram of a positioning structure and a first storage device fixed thereon according to an embodiment of the disclosure. Please refer to FIGS. 1 to 3. Each of the first position-limiting protrusions 161 and each of the second position-limiting protrusions 162 both have a position-limiting notch 163 facing the socket 14 to form a position-limiting structure or stopping structure of the fixing bracket 18 Taking the fixing bracket 18 engaged with the first position-limiting component 16a as an example, at least part of the fixing bracket 18 is engaged into or embedded in the position-limiting notch 163 of the first position-limiting protrusion 161 and the position-limiting notch 163 of the second position-limiting protrusion 162 to generate a structural interference with the first position-limiting component 16a.

After the fixing bracket 18 and the first position-limiting components 16a generate a structural interference, the distance between the fixing bracket 18 and the socket 14 is fixed. At this time, the fixing bracket 18 cannot slide in the direction away from the socket 14, and cannot be offset in the direction perpendicular to the first path L1 and the second path L2 to improve the accuracy and reliability when installing and positioning the storage device.

Furthermore, the fixing bracket 18 includes a first positioning wing portion 182 and a second positioning wing portion 184 disposed in pairs or symmetrically disposed, and are used to be respectively engaged into or embedded in the position-limiting notch 163 of the first position-limiting protrusion 161 and the position-limiting notch 163 of the second position-limiting protrusion 162. More specifically, the first positioning wing portion 182 and the second positioning wing portion 184 have positioning notches 186. The positioning notch 186 of the first positioning wing portion 182 cooperates with the position-limiting notch 163 of the first position-limiting protrusion 161, and the positioning notch 186 of the second positioning wing portion 184 cooperates with the position-limiting notch 163 of the second position-limiting protrusion 162 to guide the installation personnel to engage the fixing bracket 180 onto the casing 12 or to detach the fixing bracket 180 from the casing 12.

Please refer to FIGS. 2 and 3. When the fixing bracket 18 is engaged with the first position-limiting component 16a, the first positioning wing portion 182 and the second positioning wing portion 184 are respectively engaged into or embedded in the position-limiting notch 163 of the first position-limiting protrusion 161 and the position-limiting notch 163 of the second position-limiting protrusion 162. The first position-limiting protrusion 161 and the second position-limiting protrusion 162 are respectively engaged into or embedded in the positioning notch 186 of the first positioning wing portion 182 and the positioning notch 186 of the second positioning wing portion 184 to prevent the fixing bracket 18 from sliding in the direction away from the socket 14 and to prevent the fixing bracket 18 from offsetting in the direction perpendicular to the first path L1 and the second path L2.

When the fixing bracket 18 is engaged with the first position-limiting component 16a, the position of the fixing bracket 18 on the casing 12 is fixed. At this time, the distance between the fixing bracket 18 and the socket 14 is approximately equal to the first distance D1, and the installation personnel may continue to install a first storage device 20a. In detail, the first storage device 20a has a plugging end 21a and a fixing end 22a opposite to the plugging end 21a. The plugging end 21a is plugged into the socket 14, and the fixing end 22a bears on the fixing bracket 18 and is locked to complete the installation and positioning of the first storage device 20a.

In this embodiment, the fixing bracket 18 further includes a bearing portion 188 and a screw 189 detachably locked to the bearing portion 188. The bearing portion 188 is located between the first positioning wing portion 182 and the second positioning wing portion 184, and the fixing end 22a of the first storage device 20a bears on the bearing portion 188. The screw 189 is locked into the screw hole of the bearing portion 188 and pressed against the fixing end 22a of the first storage device 20a to lock the fixing end 22a to the bearing portion 188.

Figure 4:
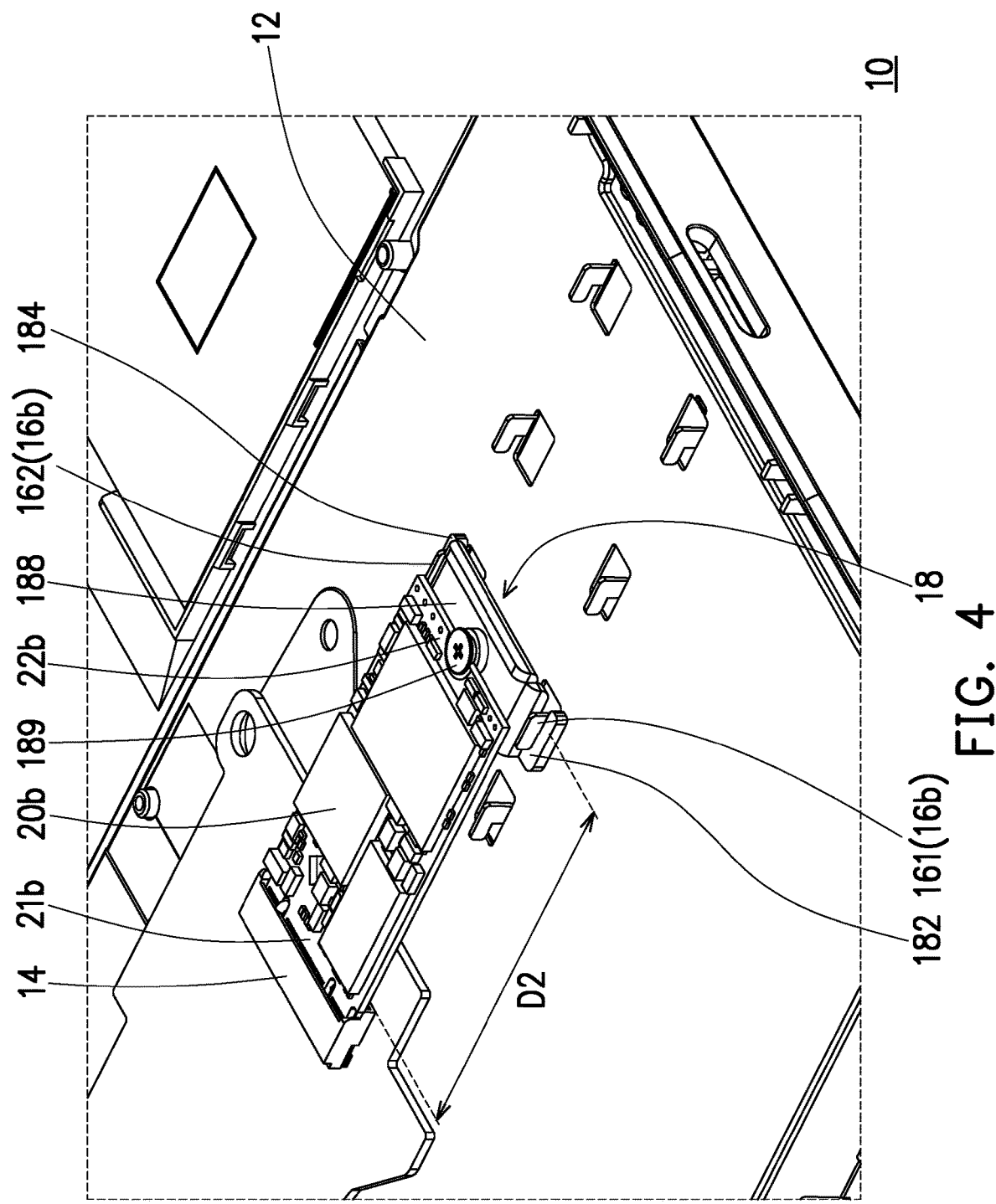
FIG. 4 is a schematic diagram of the positioning structure and a second storage device fixed thereon according to an embodiment of the disclosure.

FIG. 4 is a schematic diagram of a positioning structure and a second storage device fixed thereon according to an embodiment of the disclosure. Please refer to FIG. 4. The fixing bracket 18 is engaged with the second position-limiting component 16b, and the position of the fixing bracket 18 on the casing 12 is fixed. At this time, the distance between the fixing bracket 18 and the socket 14 is approximately equal to the second distance D2, and the installation personnel may continue to install a second storage device 20b. In detail, the second storage device 20b has a plugging end 21b and a fixing end 22b opposite to the plugging end 21b. The plugging end 21b is plugged into the socket 14, and the fixing end 22b bears on the fixing bracket 18 and is locked to complete the installation and positioning of the second storage device 20b. Furthermore, the fixing end 22b bears on the bearing portion 188. The screw 189 is locked into the screw hole of the bearing portion 188 and pressed against the fixing end 22b to lock the fixing end 22b to the bearing portion 188.

Figure 5:
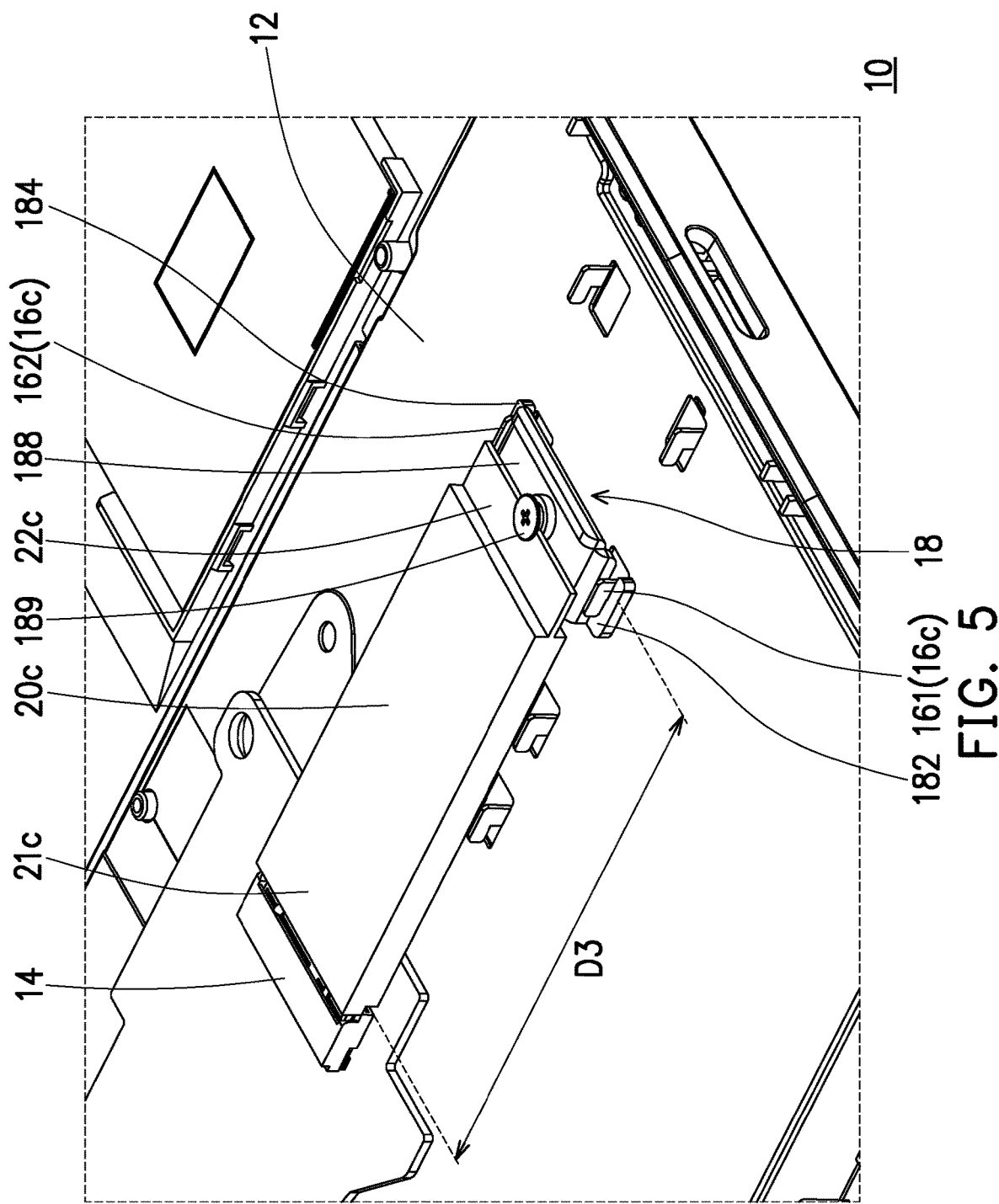
FIG. 5 is a schematic diagram of the positioning structure and a third storage device fixed thereon according to an embodiment of the disclosure.

FIG. 5 is a schematic diagram of a positioning structure and a third storage device fixed thereon according to an embodiment of the disclosure. Please refer to FIG. 5. The fixing bracket 18 is engaged with a third position-limiting component 16c, and the position of the fixing bracket 18 on the casing 12 is fixed. At this time, the distance between the fixing bracket 18 and the socket 14 is approximately equal to the third distance D3, and the installation personnel may continue to install a third storage device 20c. In detail, the third storage device 20c has a plugging end 21c and a fixing end 22c opposite to the plugging end 21c. The plugging end 21c is plugged into the socket 14, and the fixing end 22c bears on the fixing bracket 18 and is locked to complete the installation and positioning of the third storage device 20c. Furthermore, the fixing end 22c bears on the bearing portion 188. The screw 189 is locked into the screw hole of the bearing portion 188 and pressed against the fixing end 22c to lock the fixing end 22c to the bearing portion 188.

Figure 6:
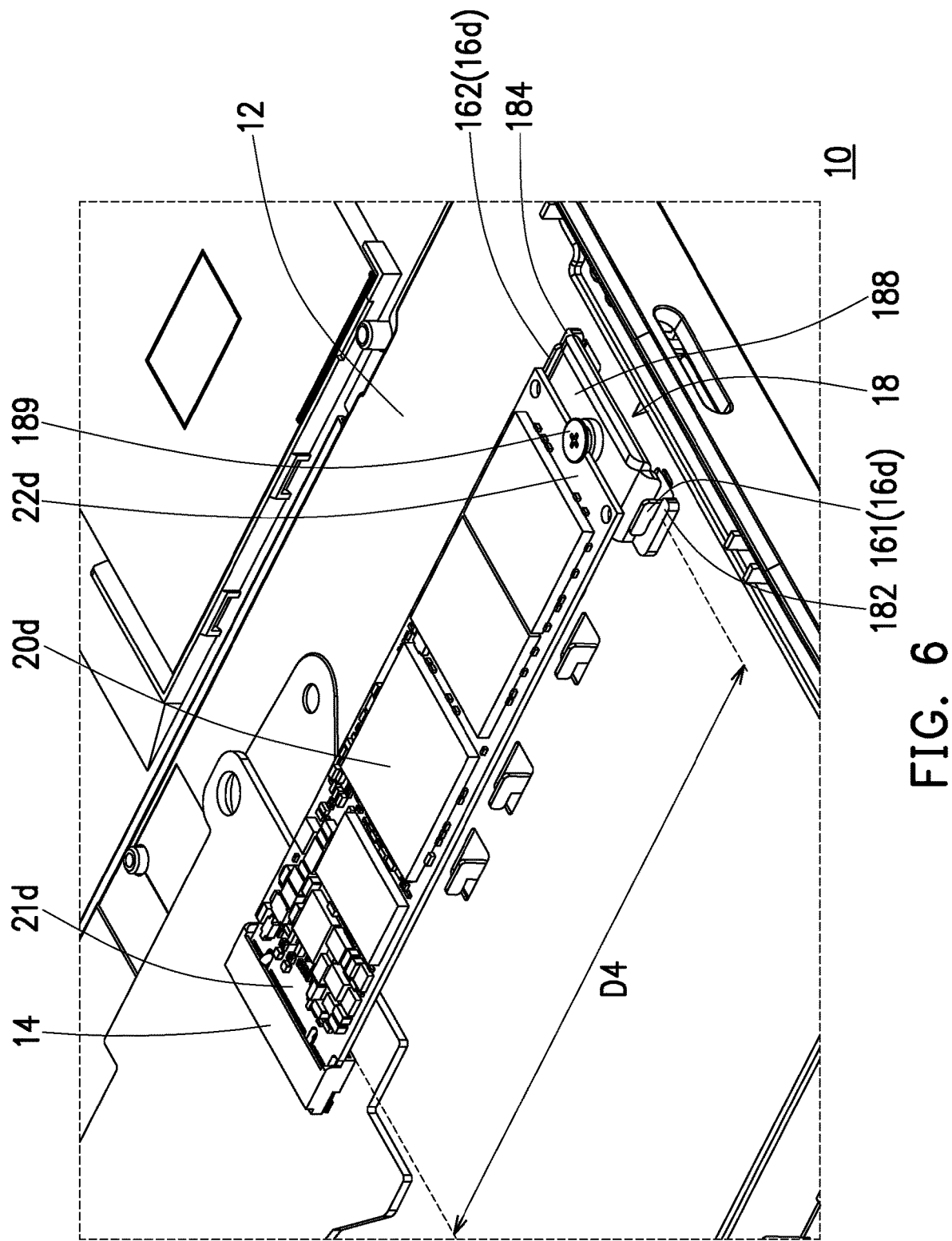
FIG. 6 is a schematic diagram of the positioning structure and a fourth storage device fixed thereon according to an embodiment of the disclosure.

FIG. 6 is a schematic diagram of a positioning structure and a fourth storage device fixed thereon according to an embodiment of the disclosure. The fixing bracket 18 is engaged with a fourth position-limiting component 16d, and the position of the fixing bracket 18 on the casing 12 is fixed. At this time, the distance between the fixing bracket 18 and the socket 14 is approximately equal to the fourth distance D4, and the installation personnel may continue to install a fourth storage device 20d. In detail, the fourth storage device 20d has a plugging end 21d and a fixing end 22d opposite to the plugging end 21d. The plugging end 21d is plugged into the socket 14, and the fixing end 22d bears on the fixing bracket 18 and is locked to complete the installation and positioning of the fourth storage device 20d. Furthermore, the fixing end 22d bears on the bearing portion 188. The screw 189 is locked into the screw hole of the bearing portion 188 and pressed against the fixing end 22d to lock the fixing end 22d to the bearing portion 188.

In particular, the specifications and sizes of the first storage device 20a to the fourth storage device 20d are different, and the installation personnel may adjust the distance between the fixing bracket 18 and the socket 14 according to the specifications and sizes of the first storage device 20a to the fourth storage device 20d.

In summary, in the positioning structure of the disclosure, the installation personnel can adjust the engagement position of the fixing bracket on the casing according to the size of the storage device, and then lock the storage device to the fixing bracket. Based on the cooperation of a single-sized fixing bracket and multiple position-limiting structures on the casing, the positioning structure of the disclosure may be universally used for at least two storage devices having different sizes. Not only is it not necessary to choose fixing brackets having different sizes to cooperate with storage devices having different specifications, it is also fairly convenient for the installation personnel to detach and install.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A positioning structure adapted for installing and fixing at least two storage devices having different sizes, wherein each of the storage devices has a plugging end and a fixing end opposite to the plugging end, the positioning structure comprising:

a casing;

a socket, disposed on the casing, wherein the plugging end of the each of the storage devices is adapted to be plugged into the socket;

at least two position-limiting components, protruding from the casing and located on a same side of the socket, wherein the at least two position-limiting components are L-shaped hooks and are unitarily formed on the casing, one of the position-limiting components keeps a first distance from the socket, and the other of the position-limiting components keeps a second distance greater than the first distance from the socket; and a fixing bracket, detachably engaged with the position-limiting component keeping the first distance from the socket, so that the fixing end of the storage device having a smaller size is fixed to the fixing bracket, or the fixing bracket, detachably engaged with the position-limiting component keeping the second distance from the socket, so that the fixing end of the storage device having a bigger size is fixed to the fixing bracket.

2. The positioning structure according to claim 1, wherein each of the position-limiting components comprises two position-limiting protrusions disposed in pairs, and the each of the position-limiting protrusions has a position-limiting notch facing the socket.

3. The positioning structure according to claim 2, wherein the fixing bracket comprises two positioning wing portions disposed in pairs, and the two positioning wing portions are respectively engaged into two position-limiting notches of any one of the position-limiting components.

4. The positioning structure according to claim 3, wherein each of the positioning wing portions has a positioning notch, two positioning notches of the two positioning wing portions cooperate with the two position-limiting notches of any one of the position-limiting components, and the two position-limiting protrusions of any one of the position-limiting components are respectively engaged into the two positioning notches of the two positioning wing portions.

5. The positioning structure according to claim 2, wherein the fixing bracket comprises a bearing portion and two positioning wing portions, the two positioning wing portions protrude from both sides of the bearing portion, the fixing end of any one of the storage devices is adapted to be fixed to the bearing portion, and the two positioning wing portions are respectively engaged into two position-limiting notches of any one of the position-limiting components.

6. The positioning structure according to claim 5, wherein the fixing bracket further comprises a screw, locked into the bearing portion and locks the fixing end of any one of the storage devices.

7. The positioning structure according to claim 1, wherein each of the position-limiting components comprises two position-limiting protrusions disposed in pairs, two position-limiting protrusions of the each of the position-limiting components comprise a first position-limiting protrusion and a second position-limiting protrusion, a plurality of first position-limiting protrusions of the position-limiting components are arranged along a first path, a plurality of second position-limiting protrusions of the position-limiting components are arranged along a second path, and the first path is parallel to the second path.

* * * * *